United States Patent [19]

Carlson et al.

[11] 4,186,108

[45] Jan. 29, 1980

[54] LIQUID COMPOSITIONS CONTAINING TRIARYLSULFONIUM COMPLEX SALTS AND OXYETHYLENE MATERIAL

[75] Inventors: Robert C. Carlson, Hudson, Wis.; Albert H. Stoskopf, Cottage Grove, Minn.

[73] Assignee: Minnesota Mining and Manufacturing Company, St. Paul, Minn.

[21] Appl. No.: 876,115

[22] Filed: Feb. 8, 1978

[51] Int. Cl.$^2$ .................... B01J 31/02; G03C 1/72
[52] U.S. Cl. ................... 252/426; 252/429 R; 252/431 R; 430/280; 204/159.18; 204/159.24
[58] Field of Search ......... 96/115 R; 252/426, 429 R, 252/431 R; 204/159.18, 159.24

[56] References Cited

U.S. PATENT DOCUMENTS

| | | | |
|---|---|---|---|
| 4,026,705 | 5/1977 | Crivello et al. | 96/115 R |
| 4,058,400 | 11/1977 | Crivello | 96/115 R |
| 4,058,401 | 11/1977 | Crivello | 96/115 R |
| 4,069,055 | 1/1978 | Crivello | 96/115 R |
| 4,102,687 | 7/1978 | Crivello | 96/115 R |
| 4,108,747 | 8/1989 | Crivello | 96/115 R |

*Primary Examiner*—Jack P. Brammer
*Attorney, Agent, or Firm*—C. Alexander; D. M. Sell; D. P. Edmundson

[57] ABSTRACT

Liquid compositions are described which comprise certain sulfonium complex salts dissolved in oxyethylene-containing organic material. The compositions are dilutable with, for example, epoxides to form photocopolymerizable compositions.

5 Claims, No Drawings

LIQUID COMPOSITIONS CONTAINING TRIARYLSULFONIUM COMPLEX SALTS AND OXYETHYLENE MATERIAL

BACKGROUND OF THE INVENTION

This invention relates to liquid compositions. More particularly, this invention relates to liquid compositions containing photodecomposable complex salts.

In assignee's copending application Ser. No. 609,898, filed Sept. 2, 1975, incorporated herein by reference, there is described a photocopolymerizable composition containing (a) an organic material containing epoxide functionality, (b) an organic material having hydroxyl functionality, and (c) a complex salt photoinitiator selected from aromatic iodonium complex salts and aromatic sulfonium complex salts. Such photocopolymerizable compositions are very useful for providing cured coatings on a variety of substrates for decorative or protective reasons. Such compositions are typically coated and cured by the manufacturer of the finished article, e.g. beverage can, label stock, coated paper, etc. Each such user of these compositions typically specifies the particular physical characteristics which the curable composition, and the cured coating, must exhibit for his particular application (e.g. color, chemical resistance, coating characteristics, etc.).

Although such photocopolymerizable compositions may be formulated by each industrial user so as to meet his specific requirements, it is much more common for such compositions to be prepared by coating formulators who specialize in the preparation of coating compositions for industrial use. The coating formulators must procure the various necessary ingredients (e.g. base resins, colorants, viscosity modifiers, curatives, etc.) from a number of different sources. With respect to the photocopolymerizable compositions referred to above, it would be highly desirable to be able to supply the coating formulator with a concentrated solution of the complex salt photoinitiator in a form which would permit ready addition to, and compatibility with, a variety of different coating compositions (particularly those which are based on cationically polymerizable materials).

There are, however, numerous requirements which must be satisfied in order for such a concentrated solution of complex salts to be useful for this purpose. For example, the liquid medium not only must be of low viscosity but it must be of a type which will cure into the coating without significant adverse effect on curing rates or physical properties of the cured film. Also, the liquid medium should permit a significant concentration (e.g. at least about 5% at room temperature) of the complex salt photoinitiator to be dissolved therein without deactivation of such photoinitiator over a long period of time (e.g. on the order of one year or more at ambient temperatures). Furthermore, such liquid concentrate must be essentially compatible with the base resin to which it is to be added to make the final curable composition.

The present invention provides a liquid concentrate which is useful for the foregoing purposes.

SUMMARY OF THE PRESENT INVENTION

In accordance with the present invention there is provided a liquid composition consisting essentially of:
(a) at least about 5% by weight of a complex salt selected from triarylsulfonium hexafluorophosphate, triarylsulfonium hexafluoroantimonate, triarylsulfonium hexafluoroarsenate and triarylsulfonium tetrafluoroborate; and
(b) at least about 15% by weight of liquid neutral oxyethylene-containing material selected from:
(i) compounds having the formula

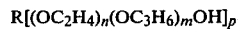

$$R[(OC_2H_4)_n(OC_3H_6)_mOH]_p$$

where R is a polyvalent neutral organic radical having a valence of p, n+m is in the range of 1 to about 25, p is in the range of 2 to 6, wherein the oxyethylene units in such compounds constitute at least 15% by weight of such compounds; and wherein the number of carbon atoms in R divided by the product of n and p is less than three;
(ii) compounds having the formula:

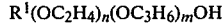

$$R^1(OC_2H_4)_n(OC_3H_6)_mOH$$

where $R^1$ is monovalent neutral organic radical, where n+m is in the range of 1 to about 25, wherein the oxyethylene units in such compounds constitute at least about 50% by weight of such compounds; and
(iii) compounds of the formula:

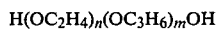

$$H(OC_2H_4)_n(OC_3H_6)_mOH$$

where n + m is in the range of 2 to about 25, wherein the oxyethylene units in such compounds constitute at least 15% by weight of such compounds;
wherein said salt is dissolved in said oxyethylene-containing material.

The compositions of the present invention may be supplied to the coating formulators in concentrated form without danger of premature photopolymerization. Since the complex salt photoinitiators in solid form are ordinarily difficult to dissolve in epoxy resin, the liquid compositions of this invention are particularly beneficial to the formulators because of their low viscosity which also contributes to ease of processing.

DETAILED DESCRIPTION OF THE INVENTION

The liquid compositions of this invention contain, as the liquid medium, one or more oxyethylene-containing materials which have at least one aliphatic primary or secondary hydroxyl group per molecule. The preferred class of normally liquid oxyethylene-containing materials is that of the formula

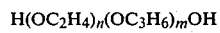

$$H(OC_2H_4)_n(OC_3H_6)_mOH \qquad I$$

where n + m is in the range of 2 to about 25, and wherein the oxyethylene units in such compounds constitute at least 15% by weight of such compounds. It is not necessary for all of the oxyethylene, or oxypropylene, units to be grouped together in any of the oxyethylene-containing materials described herein which are identified by formulas I, II and III. In other words, no particular order is required for such units in the compounds described in this specification. Accordingly, the compounds may be a block copolymer or random copolymer when m is greater than zero.

In formula I above it is most preferred that m is equal to zero and that the average value of n is in the range of 2 to 4. It also preferred that the viscosity of the compound be less than 250 cps. Representative of the preferred compounds of this formula are $HOC_2H_4OC_2H_4OH$, $H(OC_2H_4)_3OH$, $H(OC_2H_4)_4OH$, $HOC_2H_4OC_3H_6OH$, $HOC_2H_4(OC_3H_6)_2OH$, $H(OC_2H_4)_4(OC_3H_6)_6OH$, and $H(OC_2H_4)_{22}OH$.

Another class of useful oxyethylene-containing compounds is that of the formula $$R[(OC_2H_4)_n(OC_3H_6)_mOH]_p \qquad \text{II}$$

where R is a polyvalent neutral linking organic radical. The term "neutral" means that the radical is essentially free of basic and acidic groups (i.e. free of groups which have a base strength equal to or greater than the amino group of aniline, and free of groups which have an acidity equal to or greater than phenol). Preferably R has less than about 25 carbon atoms and most preferably is a hydrocarbyl radical which may be aromatic, aliphatic or cyclic, although neutral substituents such as $NO_2$, halogen, oxo, alkoxy, aliphatic hydroxyl, etc, are permissible. R may contain skeletal carbon-bonded oxygen or sulfur atoms bonded only to carbon. The valence of R is equal to p, which may range from 2 to 6. The sum of n and m is in the range of 1 to about 25. The oxyethylene units in such compounds constitute at least about 15% by weight of such compounds, and the number of carbon atoms in R divided by the product of n and p is less than three. Preferably, m is equal to zero and the average value of n is 2 to 6. Representative examples of these compounds include $C_3H_5[(OC_2H_4)OH]_3$, $C_3H_5[(OC_2H_4)_2OH]_3$, $C_4H_8[(OC_2H_4)_4OH]_2$, and $C_6H_4[C_2H_4(OC_2H_4)_3(OC_3H_6)_3OH]_2$. Mixtures of materials with varying molecular weight, and of materials containing varying oxyethylene and oxypropylene content are useful, generally typify commercially available materials, and are sometimes preferred to decrease the melting point of pure materials.

Another class of useful oxyethylene-containing compounds is that of the formula $$R^1(OC_2H_4)_n(OC_3H_6)_mOH \qquad \text{III}$$

where $R^1$ is a monovalent neutral organic radical. The term "neutral" has the same meaning as defined above. Preferably $R^1$ has less than about 25 carbon atoms and most preferably is a hydrocarbyl radical which may be aromatic, aliphatic or cyclic, although neutral substituents such as $NO_2$, halogen, oxo, alkoxyl are permissible. R may contain skeletal oxygen or sulfur atoms bonded only to carbon. The sum of n and m is in the range of 1 to about 20. The oxyethylene units in such compounds constitute at least about 50% by weight of such compounds. Preferably, m is equal to zero and the average value of n is 1 to 6. Representative examples of these compounds include $CH_3(OC_2H_4)_2OH$, $C_6H_{13}(OC_2H_4)_5(OC_3H_6)_3$, $C_5H_9C_6H_4(OC_2H_4)_{10}OH$, and $ClC_4H_8(OC_2H_4)_8OH$.

It has been found that mixtures of the above-described classes of oxyethylene-containing materials may also be used. In fact, such classes of materials are commercially available typically comprise mixtures. Mixtures of materials may be advantageous in reducing the melting point of otherwise undesirably high melting compounds. It has also been found that inclusion of compounds containing relatively high amounts of oxypropylene, or even oxypropylene homopolymers, can result in a useful mixture having decreased water-sensitivity, so long as the total amount of oxyethylene units present in the mixture meet the minimum requirements indicated above.

The oxyethylene-containing organic material, or a mixture of materials as described above, should be liquid at normal room temperatures for convenience sake.

The complex salts useful in the practice of the present invention include triarylsulfonium hexafluorophosphate, triarylsulfonium hexafluoroantimonate, triarylsulfonium hexafluoroarsenate and triarylsulfonium tetrafluoroborate. These complex salts may be represented by the formula:

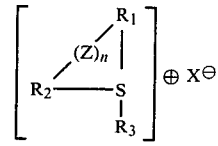

wherein $R_1$, $R_2$, and $R_3$ can be the same or different, and such groups are selected from aromatic groups having 4 to 20 carbon atoms (e.g. substituted and unsubstituted phenyl, thienyl, and furanyl) Z is selected from the group consisting of oxygen; sulfur;

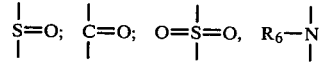

where $R_6$ is aryl (of 6 to 20 carbons, such as phenyl) or acyl (of 2 to 20 carbons, such as acetyl, benzoyl, etc.); a carbon-to-carbon bond; or $R_4$—C—$R_5$ where $R_4$ and $R_5$ are selected from the group consisting of hydrogen, an alkyl radical having 1 to 4 carbon atoms, and an alkenyl radical having 2 to 4 carbon atoms; and n is zero or 1; and $X^-$ is a halogen-containing complex anion selected from the group consisting of tetrafluoroborate, hexafluorophosphate, hexafluoroarsenate, and hexafluoroantimonate.

Certain aromatic sulfonium salts are known and recognized in the art. Triaryl-substituted sulfonium compounds, for example, can be prepared by the procedures described in G. H. Wiegand, et al., Synthesis and Reactions of Triarylsulfonium Halides, J. Org. Chem. 33, 2671–75 (1968). The preferred method for making triaryl-substituted sulfonium compounds is described in U.S. Pat. No. 2,807,648, incorporated herein by reference, from which the complex sulfonium salts can be made. The complex sulfonium salts can be prepared from the corresponding simple salts, such as the halide salts, by exchange with the complex anion in the form of the salt or free acid.

The sulfonium complex salts are substituted with three aromatic groups such as those having 4 to 20 carbon atoms and are selected from phenyl, thienyl and furanyl groups. These aromatic groups may optionally have one or more fused benzo rings (e.g. naphthyl and the like; benzothienyl, dibenzothienyl; benzofuranyl, dibenzofuranyl; etc.). Such aromatic groups may also be substituted, if desired, by one or more neutral groups which are essentially non-reactive with epoxide and hydroxy.

Examples of suitable aromatic sulfonium complex salt photoinitiators include:
triphenylsulfonium tetrafluoroborate
triphenylsulfonium hexafluorophosphate triphenylsulfonium hexafluoroantimonate
diphenylnapthylsulfonium hexafluoroarsenate
tritolylsulfonium hexafluorophosphate
anisyldiphenylsulfonium hexafluoroantimonate
4-butoxyphenyldiphenylsulfonium tetrafluoroborate
4-chlorophenyldiphenylsulfonium hexafluoroantimonate
tris(4-phenoxyphenyl)sulfonium hexafluorophosphate
4-acetoxy-phenyldiphenylsulfonium tetrafluoroborate
tris(4-thiomethoxyphenyl)sulfonium hexafluorophosphate
4-acetamidophenyldiphenylsulfonium tetrafluoroborate
10-phenylthioxanthenium hexafluorophosphate
10-phenyl-9,9-dimethylthioxanthenium hexafluorophosphate
10-phenyl-9-oxothioxanthenium tetrafluoroborate The complex salts described above are dissolved in the oxyethylene-containing materials described above to form liquid solutions in which the complex salt is at a concentration of at least about 5% by weight, preferably about 10 to 20% by weight, and may be as high as 30% by weight or more, depending upon the particular salt and oxyethylene-containing material selected and the purpose for which th concentrated composition is prepared. Although the complex salt in dry form may be dissolved directly in the oxyethylene-containing material, this is not the preferred process for preparing the compositions because it generally requires extensive heating and vigorous agitation. It is generally more convenient to prepare the complex salt by metathesis in volatile aprotic solvents (such as acetone, halogenated aliphatic compounds such as methylene chloride, etc., and mixtures thereof), then add to the salt solution the desired oxyethylene-containing compound in suitable amounts, and then evaporate the volatile solvents (generally at reduced pressure). A liquid composition of the invention is thereby obtained.

If desired, inert fillers may be included in the compositions of the invention in amounts up to about 25% by weight, although generally there would be no need to include fillers since these are generally added at the time of preparation of the final curable composition.

The liquid compositions of this invention are especially useful as concentrates which may be diluted many-fold with cationically-polymerizable materials, especially epoxides, to form photocopolymerizable compositions. Naturally, it may be desirable to also include in such diluted compositions other reactive or non-reactive materials such as flexibilizers, viscosity modifiers, tackifying agents, flow control agents, fillers, dyes, pigments, and other conventional additives.

It may be desirable to include in such compositions an unsaturated organic material (such as butyl cinnamate) for minimizing or eliminating any adventitious sulfur odor which may be produced during subsequent photopolymerization of the completely formulated coating composition. Such unsaturated material may be present in an amount roughly equal to the amount of complex salt photoinitiator present.

The invention is further illustrated by means of the following non-limiting examples, wherein the term "parts" refers to parts by weight unless otherwise indicated.

EXAMPLE 1

A liquid composition is prepared containing a triarylsulfonium hexafluorophosphate complex salt photoinitiator dissolved in triethylene glycol at a concentration of 20% by weight.

The complex salt is prepared using as starting material a triarylsulfonium chloride prepared in accordance with the procedure of Example 10 of U.S. Pat. No. 2,807,648 (Pitt), incorporated herein by reference. The product is dissolved in methyl alcohol, the solution is filtered, and the filtrate is evaporated to leave a purified pale yellow crystalline product. A solution of 8.95 parts of this product in 15 parts of water is added to a solution of 5.52 parts of $KPF_6$ in 50 parts of water, with stirring, a copious precipitate forming. After stirring for 10 minutes, there are added 40 parts by methylene chloride to dissolve the precipitate. The methylene chloride phase is then dried by adding thereto 0.5 part of anhydrous magnesium sulfate which is thereafter removed by filtration. An equal weight of acetone is added to the methylene chloride solution to form a 12% by weight solution of triarylsulfonium hexafluorophosphate complex salt.

Triethylene glycol, $HO(C_2H_4O)_3H$, 8 parts, is added to 16.67 parts of the above solution of complex salt. The resulting solution is placed in a rotary evaporator and heated to 40°–50° C. The pressure is slowly reduced to about 10 torr until the bulk of the methylene chloride and acetone is removed, then further reduced to about 1 torr until evaporation essentially ceases. A crystal clear amber liquid (of complex salt dissolved in triethylene glycol) is obtained in which the complex salt is about 20% by weight.

EXAMPLE 2

The solution of complex salt from Example 1 (1.0 part) is combined with 9.0 parts of cycloaliphatic polyfunctional epoxy resin having an average epoxy equivalent weight of 130–145 ("ERL-4221" commercially available from Union Carbide), and 0.05 part of nonionic surfactant of the formula

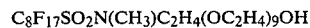

$C_8F_{17}SO_2N(CH_3)C_2H_4(OC_2H_4)_9OH$ to obtain a photocopolymerizable coating solution.

This coating solution is coated onto aluminum sheet material using a 200 line quadragravure handproofer and cured by passing the coated sheet, at 100 feet per minute, through a Radiation Polymer Co. Model QC 1202 ultraviolet light processor with two 200 watt/inch medium pressure mercury vapor lamps. The coating cured to a hard, tack-free film within one second.

This example is repeated with a polyester film as the substrate to be coated; a one second tack-free time is obtained at a processing rate of 300 feet per minute.

EXAMPLE 3

The solution of complex salt from Example 1 (1.0 part) is combined with 4.0 parts of cycloaliphatic epoxy resin ("ERL-4221") and 5.0 parts of bisphenol A diglycidylether resin having an average epoxy equivalent weight of 180–200 ("Epon 828"; commercially available from Shell Chemical Co.) and 0.05 part of nonionic surfactant described in Example 2.

The coating solution is coated onto aluminum sheet material and cured by exposure to ultraviolet light, all as described in Example 2. The tack-free time is 5 seconds at 100 feet per minute.

The coating solution is coated onto clay coated paperboard and cured by exposure to ultraviolet light, all as described in Example 2. The tack-free time is one second at 300 feet per minute.

EXAMPLE 4

A liquid composition is prepared containing a triarylsulfonium hexafluorophosphate complex salt photoinitiator dissolved in Methyl Carbitol (2-(2-methoxyethoxy) ethanol) at a concentration of 20% by weight.

The complex salt is prepared as described in Example 1. To 16.67 parts of the methylene chloride/acetone solution of the complex salt is added 8.0 parts of Methyl Carbitol. The methylene chloride and acetone are removed by the same procedure as described in Example 1. A small amount of Methyl Carbitol is then added to adjust the concentration of the complex salt to about 20% by weight in the resulting solution, since a small amount of the Methyl Carbitol originally present is vaporized during removal of the methylene chloride and acetone.

EXAMPLE 5

The solution of complex salt from Example 4 (1.0 part) is combined with 7.0 parts of cycloaliphatic epoxy resin ("ERL-4221"), 2.0 parts of hydroxyl-terminated polyester resin ("Desmophen 1700", an aliphatic polyester of adipic acid and diethylene glycol, hydroxyl equivalent weight of 1275, viscosity of 16,000 cps. at 23° C., commercially available from Mobay Chemical Co.), and 0.05 part of the nonionic surfactant described in Example 2.

The resulting liquid coating composition is coated onto aluminum sheet material, polyester film and clay coated paperboard and cured in accordance with the procedures of Examples 2 and 3. The coatings are cured rapidly to a tack-free state.

EXAMPLES 6–42

Several triarylsulfonium complex salts are dispersed in a variety of oxyethylene-containing organic materials, at various concentrations, in order to illustrate the types of oxyethylene-containing materials which are useful in the present invention. Each example involved dissolving the particular complex salt in a methylene chloride/acetone solution, after which the particular oxyethylene-containing material is added. The methylene chloride and the acetone are then removed by the procedure given in Example 1.

The following Table I lists the weight concentration of complex salt in the oxyethylene-containing material, the type of oxyethylene-containing material, and whether the salt was soluble in the oxyethylene-containing material, at room temperature, in the amount listed. The types of complex salts employed are identified as follows:

$Ar_3SPF_6$—triarylsulfonium hexafluorophosphate of Example 1
$Ar_3SSbF_6$—triarylsulfonium hexafluoroantimonate
$Ar_3SAsF_6$—triarylsulfonium hexafluoroarsenate
$Ar_3SBF_4$—triarylsulfonium tetrafluoroborate These latter three triarylsulfonium complex salts are prepared in accordance with the procedure of Example 1 using the sodium or potassium salt of the appropriate anion in each case.

TABLE I

| Ex. No. | Complex Salt | Weight % | Oxyethylene-containing material | Solubility |
|---|---|---|---|---|
| 6 | $Ar_3SPF_6$ | 2 | $HO(C_2H_4O)H$ | No |
| 7 | " | " | $HO(C_3H_6O)H$ | " |
| 8 | " | " | $HO(C_3H_6O)_2H$ | " |
| 9 | " | " | $HO(C_4H_8O)H$ | " |
| 10 | " | " | $HO(C_5H_{10}O)H$ | " |
| 11 | " | " | $HO(C_2H_4O)_2H$ | Yes |
| 12 | " | 10 | $HO(C_2H_4O)_2H$ | Yes |
| 13 | " | 20 | $HO(C_2H_4O)_3H$ | " |
| 14 | " | 30 | $HO(C_2H_4O)_4H$ | " |
| 15 | " | 10 | $HO(C_2H_4O)_5H$ | " |
| 16 | " | " | $HO(C_2H_4O_{12}H$ | " |
| 17 | " | " | $CH_3OC_2H_4OH$ | " |
| 18 | " | " | $C_2H_5OC_2H_4OH$ | " |
| 19 | " | 2 | $C_4H_9OC_2H_4OH$ | No |
| 20 | " | 10 | $CH_3O(C_2H_4O)_2H$ | Yes |
| 21 | " | " | $C_2H_5O(C_2H_4O)_2H$ | " |
| 22 | " | " | $C_4H_9O(C_2H_4O)_2H$ | No |
| 23 | " | 2 | " | Yes |
| 24 | " | 1 | $C_{15}H_{31}O(C_2H_4O)_3H$ | No |
| 25 | " | 10 | $C_{15}H_{31}O(C_2H_4O)_7H$ | Yes |
| 26 | " | " | $C_{15}H_{31}O(C_2H_4O)_9H$ | " |
| 27 | " | " | $C_9H_{19}C_6H_4O(C_2H_4O)_{10}H$ | " |
| 28 | " | " | $HOC_3H_6OC_2H_4OC_3H_6OH$ | " |
| 29 | " | " | $HO(C_3H_6O)_2C_2H_4O(C_3H_6O)_2H$ | " |
| 30 | " | " | $HO(C_3H_6O)_2C_2H_4O)_2C_3H_6O)_2H$ | " |
| 31 | " | 20 | $HO(C_3H_6O)_2C_2H_4O(C_3H_6O)_2H$ | " |
| 32 | " | 2 | $C_4H_9O(C_2H_4O)_2H$ | " |
| 33 | " | 10 | " | No |
| 34 | " | 2 | $HOC_2H_4O(CH_2)_6OC_2H_4OH$ | Yes |
| 35 | " | 5 | " | No |
| 36 | $Ar_3SSbF_6$ | 2 | $HOC_2H_4OH$ | " |
| 37 | " | " | $HOC_3H_6OH$ | " |
| 38 | " | 20 | $HO(C_2H_4O)_2H$ | Yes |
| 39 | $Ar_3SAsF_6$ | 2 | $HOC_2H_4OH$ | No |
| 40 | " | " | $HOC_3H_6OH$ | " |
| 41 | " | 10 | $HO(C_2H_4O)_2H)$ | Yes |
| 42 | $Ar_3SBF_4$ | 20 | " | " |

EXAMPLES 43–47

Several liquid compositions are prepared in which an oxypropylene-containing material is present along with an oxyethylene-containing material. In each such composition the oxyethylene-containing material is $HO(C_2H_4O)_5H$. The complex salt used in each example is that of Example 1, and it is present in the amount of 10% by weight of each composition. The type of oxypropylene-containing material, and the weight ratio of oxyethylene-containing material to oxypropylene-containing material present in the composition, is listed in the following table.

TABLE II

| Ex. No. | Oxypropylene-containing material | Weight Ratio | Solubility |
|---|---|---|---|
| 43 | $C_3H_5[(OC_3H_6)_2OH]_3$ | 45:45 | Yes |
| 44 | " | 20:70 | " |
| 45 | " | 15:75 | " |
| 46 | $HO(C_3H_6O)_3H$ | 15:75 | " |
| 47 | " | 10:80 | No |

What is claimed is:

1. A liquid composition consisting essentially of:
   (a) at least about 5% by weight of a complex salt selected from triarylsulfonium hexafluorophosphate, triarylsulfonium hexafluoroantimonate, triarylsulfonium hexafluoroarsenate and triarylsulfonium tetrafluoroborate; and
   (b) at least about 15% by weight of liquid neutral oxyethylene-containing material selected from:
   (i) compounds having the formula $$R[(OC_2H_4)_n(OC_3H_6)_mOH]_p$$

where R is a polyvalent neutral organic radical having a valence of p, n + m is in the range of 1 to about 25, p is in the range of 2 to 6, wherein the oxyethylene units in such compounds constitute at least about 15% by weight of such compounds; and wherein the number of carbon atoms in R divided by the product of n and p is less than three; and
   (ii) compounds having the formula:

$$R^1(OC_2H_4)_n(OC_3H_6)_mOH$$

where $R^1$ is monovalent neutral organic radical, where n + m is in the range of 1 to about 25, wherein the oxyethylene units in such compounds constitute at least about 50% by weight of such compounds; and
   (iii) compounds of the formula:

$$H(OC_2H_4)_n(OC_3H_6)_mOH$$

where n + m is in the range of 2 to about 25, wherein the oxyethylene units in such compounds constitute at least about 15% by weight of such compounds;

wherein said salt is dissolved in said oxyethylene-containing material.

2. A liquid composition in accordance with claim 1, wherein said oxyethylene-containing material is of the formula:

$$H(OC_2H_4)_n(OC_3H_6)_mOH$$

where n + m is in the range of 2 to about 25, and wherein the oxyethylene units in such compounds constitute at least about 15% by weight of such compounds.

3. A liquid composition in accordance with claim 2, wherein m is zero.

4. A liquid composition in accordance with claim 3, wherein n is 2 to 4.

5. A liquid composition in accordance with claim 1, wherein said complex salt is triarylsulfonium hexafluorophosphate.

* * * * *